United States Patent [19]

Underhill et al.

[11] 4,253,071
[45] Feb. 24, 1981

[54] PHASE MODULATOR CIRCUIT

[75] Inventors: Michael J. Underhill, Horsham; Michael A. G. Clark, Southampton, both of England

[73] Assignee: U.S. Philips Corporation, New York, N.Y.

[21] Appl. No.: 33,369

[22] Filed: Apr. 25, 1979

[30] Foreign Application Priority Data

Apr. 26, 1978 [GB] United Kingdom ............... 16475/78

[51] Int. Cl.³ ............................................. H03K 7/10
[52] U.S. Cl. ..................................... 332/9 T; 375/22; 375/23
[58] Field of Search ..................... 332/9 R, 9 T, 16 R, 332/16 T; 375/22, 23

[56] References Cited

U.S. PATENT DOCUMENTS 3,153,196 10/1964 McGuire ........................ 332/9 R X

*Primary Examiner*—Siegfried H. Grimm
*Attorney, Agent, or Firm*—Thomas A. Briody; Willim J. Streeter; Edward W. Goodman

[57] ABSTRACT

A problem with phase modulators particularly when modulating high frequency signals with signals of audio frequency is that noise is generated during the production of a free running ramp signal and noise is present on the modulating signal so that accurate detection of the modulating signal is not possible. In order to avoid this problem a fast ramp signal is generated by charging a low value capacitor (12) from a constant current source (13) in response to the edge of an applied timing signal. The starting voltage of the ramp signal is related to the phase of a modulating signal derived from a source having a low output impedance (25). The ramp signal is applied to a level detector (16) having a defined switching level, which detector produces an output edge signal in response to the ramp signal traversing the switching level in a given direction.

7 Claims, 6 Drawing Figures

PHASE MODULATOR CIRCUIT

BACKGROUND OF THE INVENTION

The present invention relates to a phase modulator circuit, more particularly to an edge modulator circuit. Such phase modulators have particular, but not exclusive, application, in frequency synthesiser circuits for use in communications equipment and precision test equipment, and in analog to digital converters.

Phase modulators are generally well known and three examples are disclosed in U.S. Pat. No. 2,441,418. In all three examples, the circuit comprises a first triode valve having a differentiating transformer in its anode circuit, a saw-tooth wave generator connected to its grid and a modulator tube connected to its cathode. The modulator tube comprises a second triode valve the grid-cathode bias of which, and thereby the conductivity of the second valve, is varied in accordance with an externally applied modulating signal. The anode of the second valve is connected to the cathode of the first valve and thereby the second valve controls the conductivity of the first valve in accordance with the modulating signal. A capacitor is connected in parallel with the anode-cathode current path of the second valve. The capacitor stores the charge resulting from the first valve being rendered conductive. During the time interval between successive saw-tooth waves, the charge on the capacitor leaks away via the second valve and/or a resistor connected in parallel with the capacitor.

In operation, the modulating signal applied to the second valve varies its grid-cathode bias and thereby the bias on the first tube, hence varying the critical value or time at which the first tube starts to conduct over the range of the applied saw-tooth wave. When the starting point of current flow in the first valve is varied by the modulating signal, the occurrence time of a resulting output pulse in the transformer is also varied with respect to the leading and trailing edges of the saw-tooth wave.

A problem with this known circuit is that if the capacitor has a high value, it takes a number of cycles of the saw-tooth wave to restore equilibrium if a change occurs in the circuit, this delay in restoring equilibrium renders the circuit unsuitable for high speed, precision operation. A further disadvantage of this known circuit is that the saw-tooth wave generator is free running so that the sampling of the modulating signal is fixed and cannot be controlled externally. Yet another disadvantage of this known phase modulator is that noise is produced in the saw-tooth wave generator, which noise may affect the detection of the level of the modulating signal, and noise may also arise on the modulating signal input which will cause a variable bias to be applied to the first valve thereby affecting its stability and response to changes.

In other known edge modulator circuits, a comparator is used to compare the value of a ramp with a modulating signal. The signal acts as a variable threshold and determines the time at which the comparator output changes state. These known edge modulators are affected adversely both by noise present on the modulating signal and by noise being produced in the ramp generator. Furthermore these known circuits are not generally suited to construction as integrated circuits.

SUMMARY OF THE INVENTION

An object of the present invention is to provide an edge modulator not having the noted disadvantages of the prior art pulse/edge modulators.

According to the present invention there is provided a phase modulator circuit comprising means for applying a modulating signal to the circuit, a ramp generator for generating a ramp signal in response to the receipt of an edge of a timing signal, the level relative to a nominal reference voltage from which the ramp is generated varying in response to the amplitude of an applied modulating signal, and a level detector having a defined switching level, coupled to the ramp generator, which detector produces an output edge signal in response to the ramp traversing the switching level in a given direction, the position in time of which edge is related to the amplitude of the modulating signal.

In the phase modulator circuit in accordance with the invention, the ramp generator is operated only in response to the receipt of an edge of a timing signal and thereby the ramp can be made very fast using a low value capacitor compared with that of the free-running saw-tooth wave generators of known phase modulators and hence virtually no noise is generated. By having a nominal reference voltage from which the ramp is generated, it is possible, on application of a varying modulating signal, for the phase of the output edge signal to be advanced or retarded relative to a reference edge position corresponding to a ramp generated from a level corresponding to the reference voltage.

In an embodiment of the present invention the ramp generator comprises a capacitor, a constant current source connectable to one side of the capacitor in response to the receipt of an edge of a timing signal and means for establishing the reference voltage on the other side of the capacitor, the modulating signal being also applied to the other side of the capacitor. In order to produce a repeatable ramp slope it is necessary for the constant current applied to the capaictor to be controlled precisely and such a constant current may be conveniently derived from a current mirror arrangement.

The overall current consumption of the current source may be reduced by turning-off the current source during the period following the generation of the ramp and the receipt of the next timing signal. If the turning-on and -off of the current source during said period causes undesirable voltage transients to be produced, these transients may be avoided by switching the current source to a current dumping arrangement during said period.

The timing signal may comprise a pulse-like clock signal of equal or unequal mark-to-space ratio. However provided the timing signal has a clearly defined turning-on edge, it is not essential for it to have a clearly defined turning-off edge. Such a signal may give rise to a situation that there is insufficient time for the capacitor to be discharged between successive turning-on edges of the timing signal. This problem may be avoided by providing a triggering device, for example a set/reset flip-flop or a D-type flip-flop, which has one input for receiving the timing signal edges, another input for receiving the output edge signals from the level detector and an output connected to a control input of the ramp generator. With such an arrangement the triggering devices produces a turn-on control signal in response to the edge of the timing signal and a turn-off signal in response to the output edge signal, thereby enabling the capacitor to be discharged completely in preparation for the generation of the next ramp signal.

In order to avoid noise being generated on the modulating signal input, the output impedance of the modulating signal applying means is arranged to be low.

Conveniently the ramp generator may be constructed as an integrated circuit using LOCMOS or CMOS technology which will enable the generator to be constructed cheaply and to be able to operate at the optimum design characteristics.

DESCRIPTION OF THE DRAWINGS

The present invention will now be described by way of example with reference to the accompanying drawings, wherein.

In the drawings the same reference numerals having been used to indicate the corresponding components in each of the Figures.

DESCRIPTION OF THE PREFERRED EMBODIMENT

Figure 1:
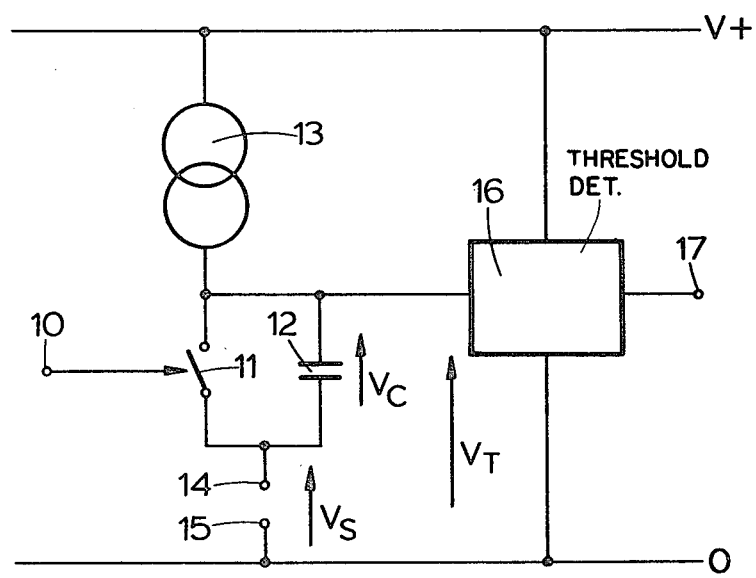
FIG. 1 is a conceptual schematic circuit diagram of an edge modulator made in accordance with the present invention, FIG. 2 are a number of waveforms associated with the edge modulator shown in FIG. 1.
Figure 2:
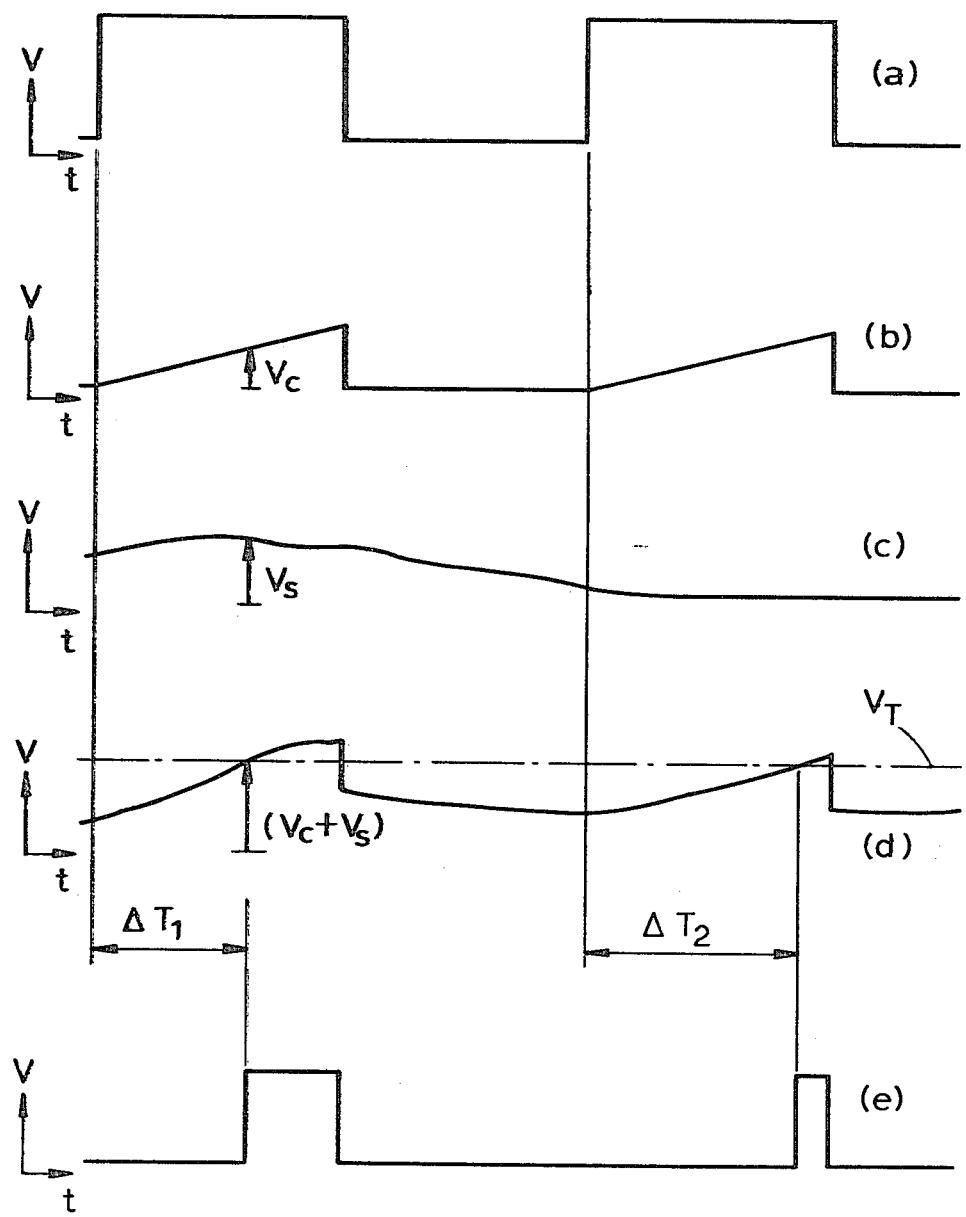

Referring to FIGS. 1 and 2, an input terminal 10 receives an input clock waveform, see FIG. 2(a), which operates a switch 11. In this conceptual embodiment, when the clock input 10 goes high, the switch 11 is turned-off and when it goes low, the switch 11 is turned-on. A capacitor 12 is connected across the contacts of the switch 11. A suitable constant current source 13 is connected to one side of the switch 11, the other side of which is connected to one terminal 14 of a pair of terminals 14 and 15 which receive a modulating signal which may be in the form of an analogue signal. The junction of the capacitor 12 and the constant current source 13 is connected to an input of a level or threshold detector 16 having an output 17 for a modulated output signal.

When the switch 11 is turned-off by the clock input going high the constant current source 13 charges up the capacitor 12. The voltage across the capacitor increases in a linear fashion as shown by the waveform 2(b). A modulating signal, waveform 2(c), is applied to the terminals 14, 15 where it is effectively summed with the waveform 2(b) to form the signal, waveform 2(d), that is applied to the level detector 16. When this voltage equals an internal threshold voltage $V_T$, the level detector 16 produces an output that has been delayed by an amount $\Delta T_1$, $\Delta T_2$ and so on, waveform 2(e), relative to the rising edge of the associated clock signal. In the illustrated diagram the circuit is reset by the switch 11 being turned-on due to the input going low. In so doing the capacitor 12 is discharged and the current is diverted to the voltage source V+.

At the instant that the level detector 16 operates, $$V_T = V_c + V_s$$

where $V_c$ is the voltage across the capacitor 12 and $V_s$ is the modulating voltage at the threshold instant.
But $V_c = I\Delta T/C$
where I is the magnitude of the current produced by the current source 13 and C is the capacitance of the capacitor 12, hence $$\Delta T = C \cdot V_T / I - C \cdot V_s / I.$$

That is the output edge is delayed, with respect to the input edge, by an amount proportional to the amplitude of the modulating voltage at the threshold instant. The constant term represents a fixed delay.

Figure 3:
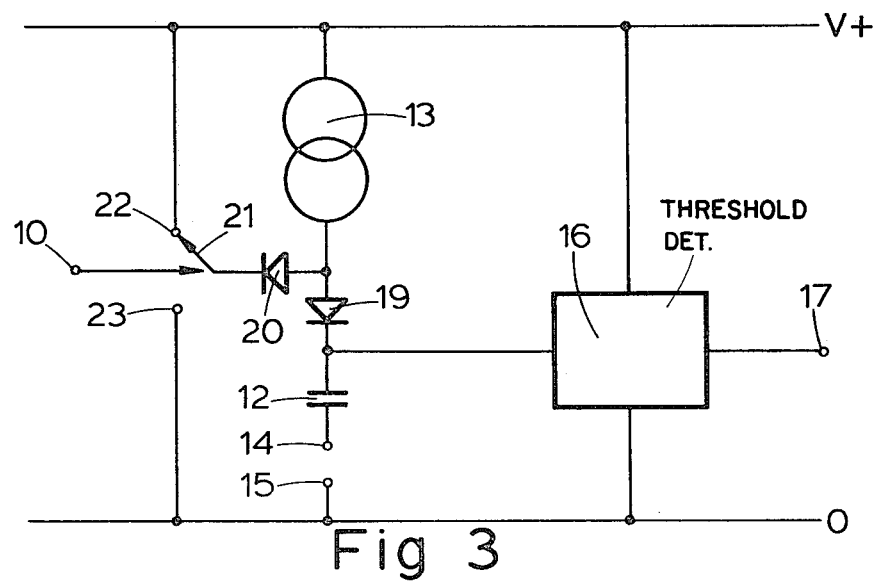
FIG. 3 is a schematic circuit diagram showing a modification of the circuit shown in FIG. 1.

FIG. 3 shows a modification of the circuit shown in FIG. 1. In the circuit of FIG. 1 the turning on and off of the constant current generator 13 by the opening and closing of the switch 11 has the effect of producing undesired voltage transients. This problem is avoided in FIG. 3 by a current dumping arrangement. This arrangement involves connecting a diode 19 between the constant current source 13 and one side of the capacitor 12. A second diode 20 is connected on the one hand to the junction of the diode 19 and the constant current generator 13 and on the other hand to the moving contact 21 of a changeover switch, which contact 21 is controlled by the clock signal. One fixed contact 22 of the changeover switch is connected to the positive voltage rail V+ and the other fixed contact 23 is connected to the zero volts line. In operation when the clock signal goes high, the moving contact 21 shifts to the contact 22 so that the diode 20 is rendered non-conductive and the capacitor is charged via the diode 19. When the clock pulse next goes low the moving contact 21 switches to the contact 23 and the current from the source 13 is dumped via the diode 20 to the zero volt line. In the meantime the capacitor 12 is discharged by an arrangement as shown in FIG. 1 or by means of a high value resistor (not shown) connected across the capacitor 12. If a high value resistor is provided its value must be such as not to effect the ramp but sufficient to enable the capacitor 12 to discharge.

Figure 4:
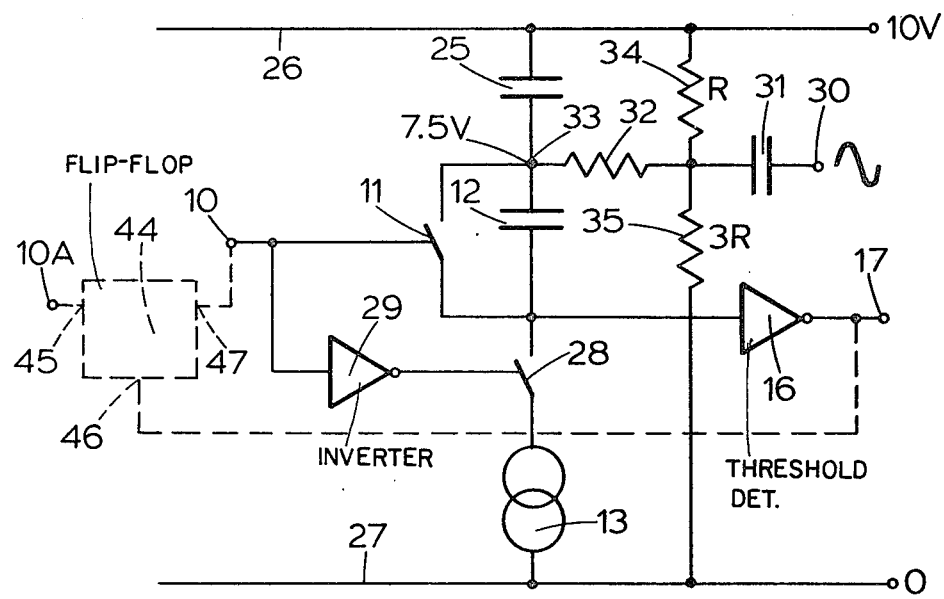
FIG. 4 is a schematic circuit diagram of one embodiment of the edge modulator, FIG. 5 are a series of waveform diagrams which facilitate the understanding of the operation of the circuit shown in FIG. 4.

FIG. 4 is a schematic circuit diagram of an embodiment of the invention. The circuit of FIG. 4 is inverted compared with the conceptual circuits of FIGS. 1 and 3 so that the ramp is a negative-going ramp compared with the positive-going ramp as shown in FIG. 2(b). Also the clock waveform is inverted so that a negative-going edge initiates the charging of the capacitor 12, rather than a positive-going edge as in FIGS. 1 and 3.

In FIG. 4 the charge/discharge circuit for the capacitor 12 comprises the switch 11 connected across the capacitor 12 and a second capacitor 25 connected between one electrode of the capacitor 12 and the positive supply rail 26 which in the illustrated embodiment is held at +10 V. The constant current source 13 is connected between a zero volt supply rail 27 and a switch 28 which is connected to the other electrode of the capacitor 12. An inverter 29 is connected between the clock signal input terminal 10 and a control input of the switch 28.

The modulating signal is applied to a terminal 30 which is a.c. coupled by a capacitor 31 and resistor 32 to a junction 33 of the capacitors 12 and 25. A potential divider comprising resistors 34 and 35 is connected between the supply rails 26, 27. The tap of the potential divider is connected to the junction 33 by way of the resistor 32. The resistance of the resistors 34 and 35 is in the ratio R:3R so that the potential at the tap of the potential divider, and thereby at the junction 33 is 7.5 volts.

The other electrode of the capacitor 12 is connected to the level detector 16.

Figure 5:
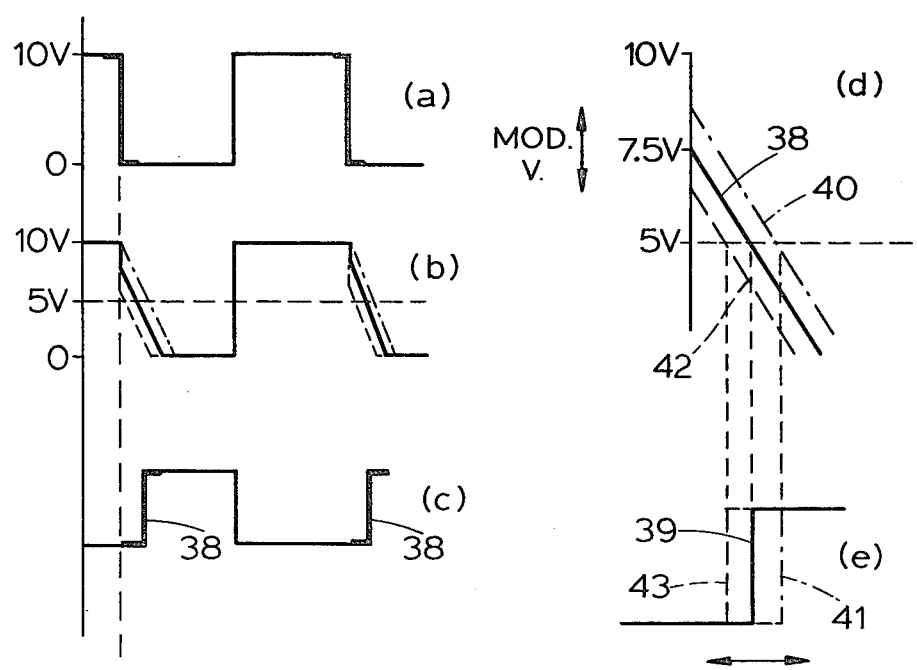

The operation of the circuit so far described will now be given with reference to the waveform diagrams of FIG. 5. Initially it will be assumed that there is no modulating signal or that the modulating signal is such that the junction 33 is at 7.5 volts.

When the clock pulse goes low, FIG. 5(a) the switch 11 is opened and the switch 28 is closed so that the capacitor 12 which had zero volts across it is charged by the constant current source 13 to produce a negative going ramp commencing at +7.5 volts and preceeding to zero volts, as shown in full lines in FIG. 5(b). The ramp is applied to the level detector 16 in which it is compared to a reference or threshold voltage of 5 volts. At the instant the ramp crosses the 5 volts level, the level detector 16 produces an output signal denoted by the edges 37 in FIG. 5(c).

In theory the ramp could start from the 10 V rail voltage by coupling the junction 33 to the rail 26. However if this is done then the flexibility in the operation of the circuit with variations in the amplitude of the modulating signal relative to a reference level, that is 7.5 volts, would be lost.

Referring to FIGS. 5(d) and 5(e), if the junction 33 is at 7.5 volts when the clock signal is applied to the input 10 then the negative going ramp 38 is produced. The ramp 38 on crossing the 5.0 volt threshold level in the level detector 16 causes a positive going edge 39 to be produced. If the modulating signal causes the voltage at the junction 33 to rise to say 8.5 volts, the ramp, that is ramp 40, begins at 8.5 volts and intersects the 5.0 volt threshold later causing a positive edge 41 to be produced. Alternatively if the modulating signal causes the voltage at the junction 33 to drop to say 6.5 volts then the ramp, that is ramp 42, begins at 6.5 volts and intersects the 5.0 volt threshold earlier causing a positive edge 43 to be produced. Hence depending on the amplitude of the modulating signal the positive edge produced can lead or lag the reference edge 39. Irrespective of the amplitude of the modulating signal, the inclination of the ramps should be the same which means that the current produced by the current source 13 is the same. Furthermore in order to reduce any noise on the modulating input 30 from adversely affecting the stability of the 7.5 volts at the junction 33, the modulating signal input circuit should have an effective low source impedance during the charging of the capacitor 12. With this in mind the capacitance of the capacitor 25 is in general made much larger, from 10 to 100 times larger, than that of the capacitor 12. If the impedance of the modulating signal source is low then the capacitance of the capacitor 25 may be selected to be nearer to that of the capacitor 12. The capacitors 12 and 25 form a capacitive voltage divider which helps stabilise the nominal 7.5 volts at the junction 33.

The choice of the value of the capacitor 12 is a dependent at least in part on the desired sensitivity of the modulator circuit, the current source 13 and the repetition frequency of the clock source. If the edge modulator is operated in a frequency synthesiser or phase locked loop such that its output from the terminal 17 is frequency multiplied, then the modulation index of the modulator is increased by the multiplication factor thereby increasing the overall sensitivity of the circuit such that small changes in the modulating signal applied to the terminal 30 are rapidly detected. Modulation index, m, defined as the peak phase deviation in radians is determined by:

$$m = 2\pi(Tp/T)$$

where Tp is the deviation of the modulating signal and T the phase angle between successive edge signals from the modulator.

In the case of a frequency synthesiser operating at for example 125 MHz and having infinitely fast working circuits, the theoretical maximum modulation index is $\pi$ (that is $\pm \pi$) at the repetition frequency of the modulator. However, in a practical circuit, the modulating index is typically 1 radian at the repetition frequency of the modulator. At 125 MHz a shift in the waveform of 8 nS is equivalent to $2\pi$ radian phase shift. In order that the modulator when incorporated into a frequency synthesiser, can have a desired modulation index, for example less than $\pi$, $\pi$ or greater than $\pi$, at such a repetition frequency (125 MHz), the repetition frequency of 125 MHz is divided by $10^4$ to produce a frequency of 12.5 KHz. This lower frequency is phase compared with a 12.5 KHz reference frequency. An error (or shift) of 8 ns at 12.5 KHz corresponds to a small modulation index at that frequency. However when this small modulation index at 12.5 KHz is multiplied by $10^4$, then it corresponds to a high modulation index at 125 MHz. With a modulation index of $\pi$ or less at the repetition frequency of the modulator, the ramp produced by the charging of the capacitor has to be very fast and, as a result, it is virtually insensitive to noise. Accordingly the combination of providing a fast ramp and deriving the modulating signal from a low impedance source enables the circuit to be largely unaffected by noise while being sensitive to variations in the modulating signal which vary the starting level of the ramp at the occurrence of each clock signal.

The clock signal need not be of an even mark/space ratio and in fact as long as the negative going edges are present there is no need for a clearly defined positive going edge following each negative going edge. The critical factor is for the switches 11 and 28 to be reset in time to allow the capacitor to be discharged before the next negative going edge arrives.

The method of ensuring that this critical factor is met and to enable the modulator to operate over a wide frequency range, is to provide a flip-flop 44 (FIG. 4) having one input 45 for receiving the clock signal applied to a terminal 10A, a second input 46 connected to the output of the level detector 16 and an output 47 connected to the terminal 10. In one embodiment the flip-flop 44 is a set/reset flip-flop with the input 45 being the set input and the input 46 being the reset input. Thus the negative going edge of the clock signal (FIG. 5a) sets the flip-flop 44 and its output causes the switch 11 to open and the switch 28 to close thereby enabling the capacitor 12 to be charged. At the occurrence of a positive going edge on the output of the level detector 16, the flip-flop 44 is reset causing the switch 11 to close, the switch 28 to open thereby enabling the capacitor 12 to discharge through the resistor 32 and the potential divider.

In another embodiment the flip-flop 44 is a D-type flip-flop, the input 45 is connected to receive the clock signal applied to the terminal 10A, a "1" signal is applied continuously to a D input (not shown) and the input 46 is a reset input connected as before to the output of the level detector 16. As the operation of this embodiment is essentially the same as that as the previously described embodiment it will not be described.

The edge modulator may be constructed using any suitable technology and may be conveniently constructed as an integrated circuit using field effect transistors, particularly complementary CMOS or LOCMOS devices. A circuit using such devices is shown in FIG. 6.

Figure 6:
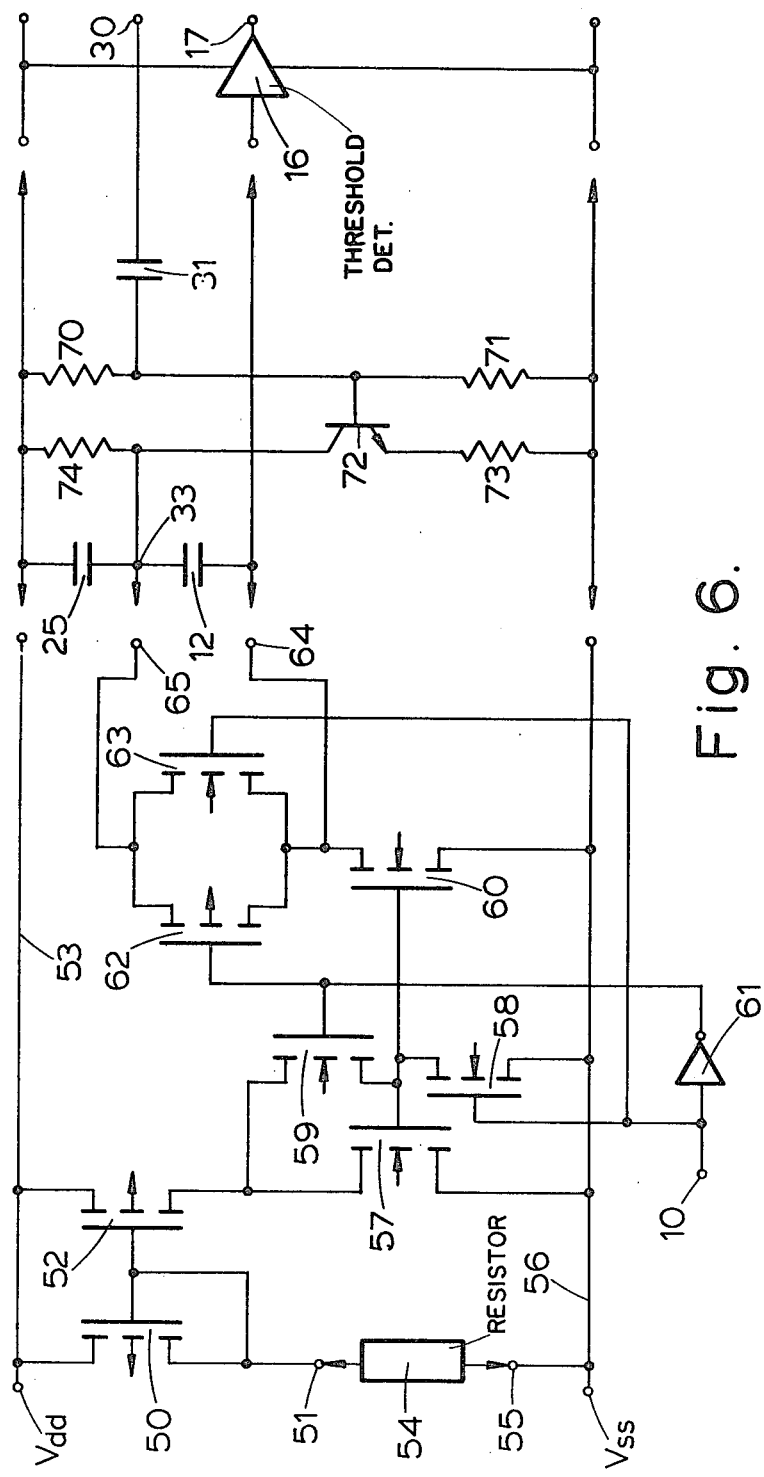
FIG. 6 is a schematic circuit diagram of a practical embodiment of the edge modulator using CMOS or LOCMOS devices.

In FIG. 6, the circuit shown may be conveniently considered as comprising three parts, the constant current generator and switches constructed as an integrated circuit including complementary field effect transistors (FET); a modulating input circuit including the ramp capacitor 12 constructed from discrete components; and the level detector 16 which is an integrated circuit comprising a gate with a defined switching level, for example a comparator or a Schmitt trigger, the latter is not a preferred choice because of its hysteresis between turn-on and turn-off.

The current generator and switches comprise a P-type FET 50 having its gate and drain electrodes connected together and connected on the one hand to a terminal 51 and on the other hand to the gate of a P-type FET 52. The sources of the FETs 50 and 52 are conncted to the $V_{dd}$ supply rail 53. A resistor 54 which in the illustrated circuit is an external resistor is connected between the terminal 51 and a terminal 55 connected to the $V_{ss}$ rail 56. The resistor 54 determines the current flow through FET 50, which current is mirrored to N-type FET 60 via the FET 52 and N-type FET 57. The FET 60 forms the current source sink of the circuit. The current source is switched-on and -off by N-type FETs 58, 59. The gate of the FET 58 is connected to the clock signal input terminal 10, while the gate of the FET 59 is connected by way of an inverter 61 to the terminal 10. The source of the FET 60 is connected to the rail 56 and its drain is connected to a series switch comprising P-type FET 62 and N-type FET 63.

The sources of the FET 62, 63 are connected together and the common connection is coupled to the drain of the FET 60 and to a terminal 64, and a common connection of the drains of the FETs 62, 63 is coupled to a terminal 65. The ramp capacitor 12 is connected to the terminals 64, 65.

The operation of this part of the circuit will now be described. When the clock input 10 goes low (FIG. 5(a)) the FETs 58 and 63 are rendered non-conductive, simultaneously the output of the inverter goes high rendering the FET 59 conductive and the FET 62 non-conductive. In this mode the current flowing in the FET 50 is mirrored to the FET 60 by a double current mirror arrangement formed by the FETs 50, 52 and by the FETs 57, 60 (FET 59 being conductive). Hence the current through the FET 57 causes the precise bias voltage to be applied to the gate of FET 60 which in turn applies a precise and repeatable current to the capacitor 12 as it is charged following the receipt of a clock signal on the input 10. The ramp voltage is applied to the level detector 16 which is connected to the terminal 64.

At the occurrence of the clock input 10 going high, the state of conduction of the FETs 58, 59, 62, 63 changes so that the gates of the FETs 57 and 60 are connected to the rail 56 by way of the new conductive FET 58. The FETs 62, 63 are conductive and discharge the capacitor 12 through the source-drain path of the FET 60. The capacitor 12 is then ready to be charged on the receipt of the next clock pulse.

The number of FETs may be reduced by omitting the FETs 58, 59 which are not essential for the operation of the circuit, but are included to reduce current consumption as they switch the current source on and off.

If desired the FETS 50 and 52 may be omitted and the resistor 55 connected between the rail 53 and the drain of the FET 57.

The modulating signal input circuit comprises the capacitor 31 connected on the one hand to the modulating signal input terminal 30 and on the other to a junction of two resistors 70, 71 which provide the base bias of an NPN transistor 72 acting as a buffer amplifier. The emitter of the transistor 72 is connected by a resistor 73 to the rail 56 and the collector of this transistor 72 is connected to the junction 33 to the capacitors 12, 25 and to a resistor 74 connected to the rail 53.

In the operation of the modulating signal input circuit, the modulating signal is applied to the base of the transistor 72 via the terminal 30 and the capacitor 31 and causes a variation in the collector current so that the potential at the junction 33, which is nominally at 7.5 volts, varies in response to the modulating signal. As explained in connection with FIG. 5, the voltage from which charging begins is related to the amplitude of the modulating signal and the time taken to charge the capacitor 12 along a predetermined ramp to a fixed level provides the edge signal (see FIGS. 5(d) and (e)).

In the illustrated circuit the external components have the following values or are of the type indicated

| | |
|---|---|
| $V_{dd}$ | +10V |
| $V_{ss}$ | 0V |
| Resistor 54 | 20 K Ω |
| Resistor 70 | 180 K Ω |
| Resistor 71 | 33 K Ω |
| Resistor 73 | 2.2 K Ω |
| Resistor 74 | 5.6 K Ω |
| Capacitor 12 | 100 pF |
| Capacitor 25 | 2.2 nF |
| Capacitor 31 | 15 μF |
| Transistor 72 | BC 549 |
| Clock frequency | 125 MHz |
| Modulation frequency | Audio |

In general the value of the capacitor 12 determines the slope of the ramp and has to be selected to give adequate modulation depth, but kept as small as possible so as not to introduce noise.

If desired the illustrated edge modulator can be made into a frequency modulator by changing the buffer amplifier, transistor 72, into an integrator. This is possible by changing the value of the capacitor 25 to a higher value, for example 1 uF.

If it is desired to have the modulator in a frequency synthesiser at a point where it operates at a frequency n times the phase comparator reference frequency, power may be saved by strobing the modulator, particularly in a situation where the modulation frequency is being changed rapidly, then the clock input can be controlled so that only one out of every n edges operates the modulator, the other (n-1) edges inhibit the modulator. The operative edge is also the edge which operates the phase comparator in the frequency synthesiser.

In the circuit shown in FIG. 6 the current source comprises a current mirror. If desired this source may comprise a fixedly biased transistor. Further in those cases where the FETs are symmetrical devices, the sources and drains thereof may be connected the opposite way around to that described.

We claim:

1. A phase modulator circuit comprising means for applying a modulating signal to the circuit; a ramp generator for generating a ramp signal in response to the receipt of an edge of a timing signal, the level, relative to a nominal reference voltage, from which the ramp is generated, varying in response to the amplitude of an applied modulating signal; and a level detector, having a defined switching level, coupled to the ramp generator, which detector produces an output edge signal in response to the ramp passing the switching level in a given direction, the position in time of the edge signal being related to the amplitude of the modulating signal; characterized in that the ramp generator comprises a capacitor; a constant current source connectable to one side of the capacitor in response to the receipt of an edge of a timing signal; and means for establishing the reference voltage on the other side of the capacitor, the modulating signal being also applied to the other side of the capacitor.

2. A modulator circuit as claimed in claim 1, wherein the constant current source comprises a current mirror arrangement.

3. A modulator circuit as claimed in claim 1 or 2, further including means for turning-off the current source during a period following the generation of the ramp and the receipt of the next timing signal.

4. A modulator circuit as claimed in claim 1 or 2, wherein the ramp generator includes a current dumping arrangement including a switching device operable in response to the receipt of the timing signal to switch the current source from the dumping arrangement to the capacitor at least for the duration of the generation of the ramp signal.

5. A modulator circuit as claimed in any one of claim 1 or 2, further comprising a triggering device having a first input for receiving the edge of the timing signal, a second input coupled to the output of the level detector and an output connected to a control input of the ramp generator, whereby the triggering device applies a turn-on control signal to the ramp generator in response to the edge of the timing signal and a turn-off control signal to the ramp generator in response to the output edge signal being produced by the level detector.

6. A modulator circuit as claimed in claim 5, wherein the modulating signal applying means has a low output impedance.

7. A modulator circuit as claimed in claim 6, wherein the ramp generator is constructed as an integrated circuit using LOCMOS or CMOS technology.

* * * * *